United States Patent
Chang

(10) Patent No.: US 6,534,407 B2
(45) Date of Patent: Mar. 18, 2003

(54) METHOD FOR REDUCING DISHING EFFECTS DURING A CHEMICAL MECHANICAL POLISHING PROCESS

(75) Inventor: Ching-Yu Chang, I-Lan Hsien (TW)

(73) Assignee: Macronix International Co. Ltd., Hsin-Chu (TW)

( * ) Notice: Subject to any disclaimer, the term of this patent is extended or adjusted under 35 U.S.C. 154(b) by 25 days.

(21) Appl. No.: 09/871,663

(22) Filed: Jun. 4, 2001

(65) Prior Publication Data

US 2002/0019135 A1 Feb. 14, 2002

(30) Foreign Application Priority Data

Jun. 9, 2000 (TW) .......................................... 089111237

(51) Int. Cl.[7] ........................................... H01L 21/302
(52) U.S. Cl. ............................. 438/692; 216/38; 216/89
(58) Field of Search .................................. 438/691, 692, 438/693; 216/2, 38, 89

(56) References Cited

U.S. PATENT DOCUMENTS

| | | | | | |
|---|---|---|---|---|---|
| 5,645,736 | A | * | 7/1997 | Allman | 106/6 |
| 5,770,103 | A | * | 6/1998 | Wang et al. | 252/79.1 |
| 6,117,783 | A | * | 9/2000 | Small et al. | 106/3 |
| 6,303,506 | B1 | * | 10/2001 | Nojo et al. | 216/38 |
| 6,313,039 | B1 | * | 11/2001 | Small et al. | 106/3 |
| 6,420,269 | B2 | * | 7/2002 | Matsuzawa et al. | 438/693 |

* cited by examiner

Primary Examiner—Long Pham
Assistant Examiner—Ginette Peralta
(74) Attorney, Agent, or Firm—Winston Hsu

(57) ABSTRACT

A method for reducing dishing effects is provided. The method is applied to polish a surface of a wafer containing a silicate film thereon. The method comprises using a polishing slurry containing organic alkyl or aryl compound with at least one hydroxyl group (i.e. ROH compound) during the process of polishing the silicate film. An organic hydrophobic layer created over the silicate film in contact with the ROH compound thus alleviates the undesirable dishing effects. The organic hydrophobic layer is thereafter cleaned using ozone-containing deionized water.

15 Claims, 4 Drawing Sheets

METHOD FOR REDUCING DISHING EFFECTS DURING A CHEMICAL MECHANICAL POLISHING PROCESS

BACKGROUND OF THE INVENTION

1. Field of the Invention

The present invention generally relates to a chemical mechanical polishing (CMP) process, and more particularly, relates to a method for reducing dishing effects during a chemical mechanical polishing process.

2. Description of the Prior Art

As integrated circuit device dimensions have decreased, it has become increasingly common within advanced integrated circuits to employ trench isolation methods, such as shallow trench isolation (STI) methods, to form trench isolation regions nominally coplanar with adjoining active semiconductor regions of semiconductor substrates. Such STI methods typically employ a chemical mechanical polishing (CMP) method to provide a nominally planarized surface to a trench fill dielectric layer formed within the trench. Trench isolation regions nominally coplanar with active semiconductor regions within semiconductor substrates are desirable since they optimize, when subsequently forming patterned layers upon those nominally coplanar trench isolation regions and active semiconductor regions, the limited depth-of-focus (DOF) typically achievable with advanced exposure tooling.

CMP is a process used to create smooth, planar layers on wafers, which essentially provides for polishing a wafer by rubbing a polishing pad against the wafer to grind the surface layer. The polishing pad is saturated with an abrasive slurry solution that may aid the planarization. A common slurry used for polishing silicate film is colloidal silica in an aqueous KOH solution. CMP tools are well known in the art. Such tools are disclosed in U.S. Pat. Nos. 3,841,031 and 4,193,226. The tools include a polishing wheel with the wafer attached to the wheel. As the wheel rotates, the wafer is forced against a wetted polishing surface and the surface is planarized.

During a CMP process applied on a silicon dioxide layer, there is a thin hydrated silica gel layer created over the surface of the silicon dioxide layer. The reaction may be described by the following formulas:

Si—O—Si+H$_2$O→2SiOH (SiO$_2$)$_x$+2H$_2$O→(SiO$_2$)$_{x-1}$+Si(OH)$_4$

According to the above equations, a global planarization is achieved by rapidly and repeatedly removing the readily formed hydrated silica gel layers. In an aqueous environment, the surface undergoes a hydration reaction with H$_2$O to produce a surface network of hydroxylated Si molecules. Dissolution of this network generally occurs above a pH of 9.0 because of the solubility of the reaction product at high pH. Typically, the formation of Si(OH)$_4$ is accelerated in a more alkaline environment. A most common composition of slurry for polishing silicate films includes abrasive, for example, fumed silica, deionized water, alkaline solvent, and buffer solution. A normal pH for this composition is usually between 10.5 and 11.5.

While trench isolation methods employing CMP planarizing of trench fill dielectric layers formed into isolation trenches are therefore quite desirable and common in the art of advanced integrated circuit fabrication, such trench isolation methods are nevertheless not entirely without problems. In particular, it is known in the art that trench isolation methods employing CMP planarizing of trench fill dielectric layers formed into isolation trenches often, when the isolation trenches are comparatively wide, provide isolation trenches where a planarized trench fill dielectric layer formed therein is dished.

In order to totally remove the trench fill dielectric layer above a silicon nitride stop layer, the silicon nitride stop layer is strategically over-polished. Since the hardness of silicon nitride is higher than that of the trench fill dielectric layer, the trench fill dielectric layer is polished away with a higher rate to cause a dishing top surface of STI. The dishing phenomenon affects the performance of the device.

Since dishing within planarized trench fill layers formed within trenches within integrated circuits is generally undesirable, it is therefore in general towards forming, without dishing, planarized trench fill layers within trenches within integrated circuits that the present invention is directed. Methods for preventing dishing during a CMP process are known in the art of integrated circuit fabrication. For example, Bose et at., in U.S. Pat. No. 5,492,858 discloses a method for forming a planarized trench fill dielectric layer within an isolation trench within an integrated circuit. The method employs, within the isolation trench, a barrier layer that allows for densifying, through steam annealing, a conformal silicon oxide trench fill dielectric layer, which may then subsequently be planarized, while avoiding dishing, through a chemical mechanical polish (CMP) planarizing method.

In addition, Homma et at., in U.S. Pat. No. 5,420,075 discloses a method for selectively depositing insulator layers into inter-metal spacings within patterned metal layers within integrated circuits. The method provides for treating a portion of a patterned metal layer with a fluorine containing reactive ion etch (RIE) plasma to inhibit formation of a chemical vapor deposited (CVD) silicon oxide layer upon that portion of the patterned metal layer.

SUMMARY OF THE INVENTION

It is an object of this invention to provide an effective and simple method for reducing dishing of a polished silicate film during a CMP process.

It is a further object of this invention to provide a method for reducing dishing during an isolating trench formation process by using a polishing slurry to which is added a quantity of alcohol and/or phenol before the polishing end point.

According to one aspect of the present invention, a method for reducing dishing effects is provided. The method is applied to polish a surface of a wafer containing a silicate film thereon. The method comprises using a polishing slurry containing an organic alkyl or aryl compound with at least one hydroxyl group (i.e. ROH compound) during the processing of polishing the silicate film. An organic hydrophobic layer is created over the silicate film in contact with the ROH compound, thus alleviating the undesirable dishing effects. The organic hydrophobic layer is thereafter cleaned using ozone-containing deionized water.

According to a further aspect of the present invention, the present invention comprises the following essential chemical mechanical polishing steps:

(1) starting a chemical mechanical polishing process, at a polishing time=0 second, by using an alkaline slurry containing water, abrasives and soluble inorganic salts;

(2) at a polishing time=t1 second, adding a predetermined quantity of alcohol and/or phenol into the alkaline slurry;

(3) at a polishing time=t2 second, detecting an end point of the CMP process, wherein t2>t1; and (4) terminating the CMP process.

To promote the formation of the hydrophobic layer, the pH of the slurry is controlled to between 7 and 13. It is advantageous that by addition of the ROH compound into the slurry during the CMP process, a hydrophobic layer is created over a silicate film, thereby reducing dishing of the silicate film in a wide trench. In addition, the organic hydrophobic layer is easily removed by ozone-containing water.

These and other objectives of the present invention will no doubt become obvious to those of ordinary skill in the art after having read the following detailed description of the preferred embodiment that is illustrated in the various figures and drawings.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which forma material part of this disclosure, wherein.

DETAILED DESCRIPTION OF THE PREFERRED EMBODIMENT

Figure 1:
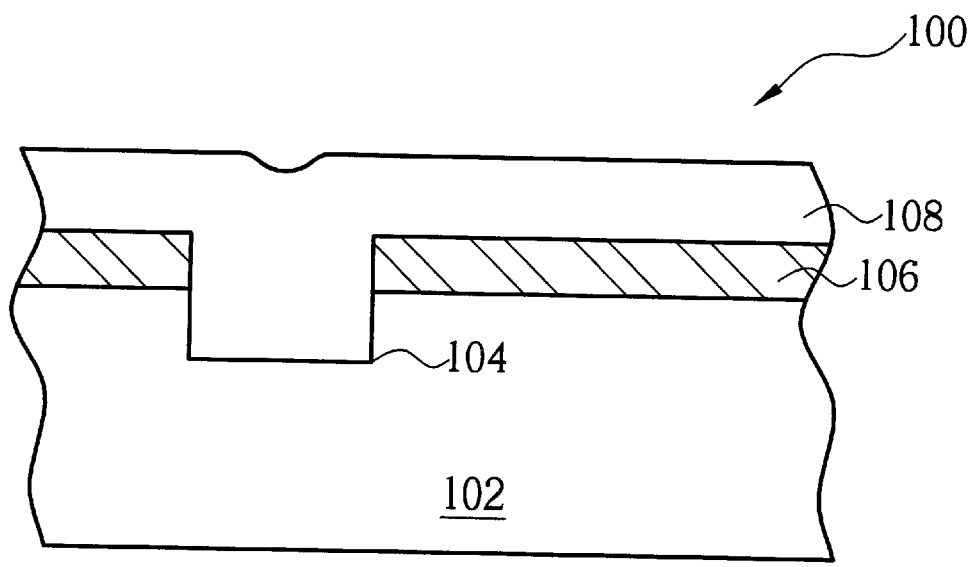
FIG. 1 is a cross-sectional schematic diagram showing a wafer to-be-polished before a CMP process.

Please refer to FIG. 1. FIG. 1 is a cross-sectional schematic diagram showing a wafer to-be-polished before a CMP process.

As shown in FIG. 1, semiconductor wafer 100 comprises a silicon substrate 102 with a wide trench 104 formed thereon, a polishing stop layer 106 formed outside the trench 104, and a trench-fill dielectric 108 filling the trench 104 and covering the polishing stop layer 106. In the preferred embodiment of the present invention, the trench-fill dielectric 108 is silicon dioxide. However, other doped silicate glasses such as phosphosilicate glass (PSG), borophosphosilicate glass (BPSG), or fluorinated silicate glass (FSG) are also suitable for the present invention. The polishing stop layer 106 is a silicon nitride layer.

Figure 2:
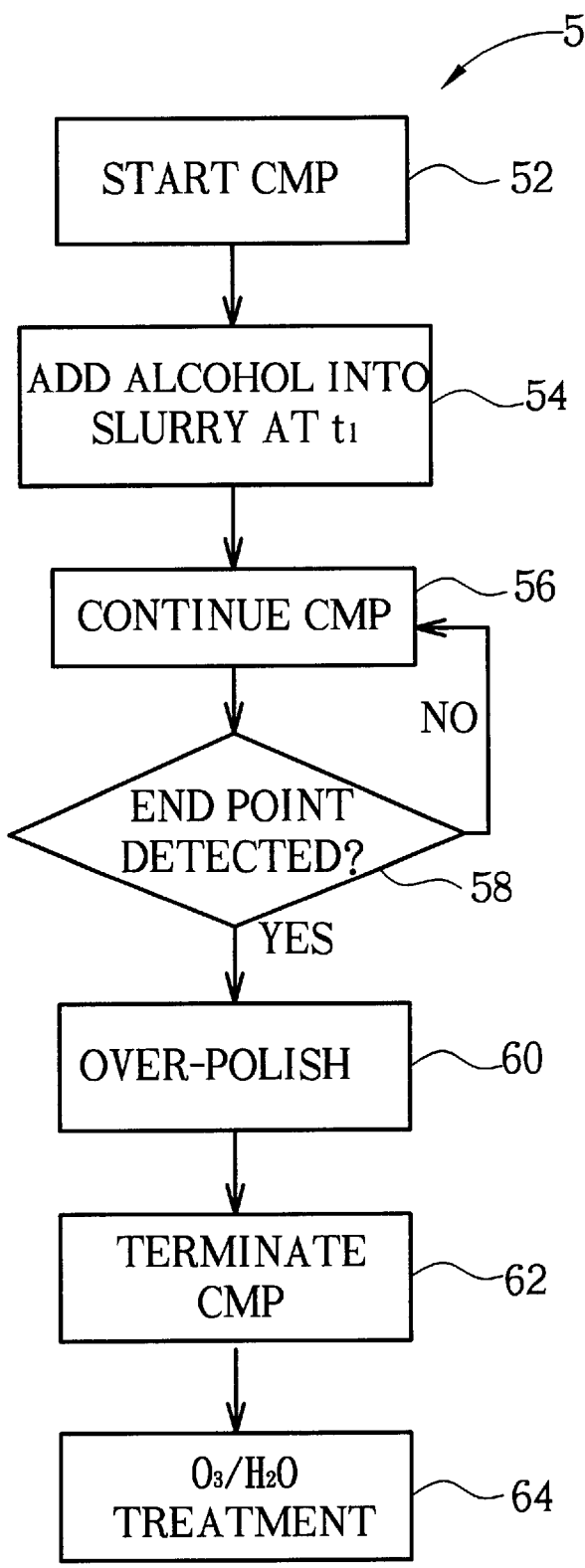
FIG. 2 is a flow chart showing the method for reducing dishing during a CMP process according to the present invention.

A flow 50 utilizing chemical and mechanical abrasion to planarize and remove surface irregularities of a topological surface, according to the present invention, is shown in FIG. 2. A CMP process starts by placing a semiconductor wafer face-down on a polishing pad which is fixedly attached to a rotatable table or platen (step 52). Elevationally extending features of the semiconductor wafer are positioned such that they contact the slurry attributed to the polishing pad. During the CMP process, the polishing pad and semiconductor wafer may be rotated while a carrier holding the wafer applies a downward force upon the polishing pad. An abrasive slurry is deposited upon the surface of polishing pad. In this manner, the slurry occupies an interface between the pad and the surface of the wafer.

The slurry initiates the polishing process by chemically reacting with the surface material being polished. The rotational movement of the polishing pad relative to the wafer causes abrasive particles entrained within the slurry to physically strip the reacted surface material from the wafer. The polishing slurry includes abrasives, for example, fumed silica, deionized water, alkaline solvent, and buffer solution. The abrasives are typically composed of silica, alumina, or ceria. Sometimes, surfactants may be added according to desired purposes. A normal pH for this composition is usually between 7 and 13, preferably between 10.5 and 11.5. To achieve this pH, bases such KOH, NaOH or $NH_4OH$ are used.

After t1 seconds from the start of the CMP process, a predetermined quantity of alcohol is added into the polishing slurry, which is fixed at a pH between 10.5 and 11.5 (step 54). In another case according to the present invention, a predetermined quantity of phenol is added into the polishing slurry. In still another case according to the present invention, both alcohol and phenol are added into the slurry. The time period t1 depends on the thickness of the polished silicate film and the composition of the film. For example, for a silicon dioxide formed by a plasma-enhanced chemical vapor deposition (PECVD) method having a thickness of about 1000 angstroms, t1 ranges from 55 seconds to 65 seconds. After the addition of the alcohol or phenol, a hydrophobic layer is formed over the polished silicate film. The concentration of the alcohol in the slurry may be within a range of about 0.01% to 10% by weight.

The alcohol used is selected from a group consisting of methyl alcohol, ethyl alcohol, n-propyl alcohol, isopropyl alcohol, butyl alcohol, pentyl alcohol, n-hexanol, cyclohexyl alcohol, heptyl alcohol, octyl alcohol and the like. The phenol is selected from a group consisting of phenol, benzyl alcohol, diphenylcarbinol, and the like.

Still referring to FIG. 2, after the addition of the alcohol or phenol (step 54), the CMP process goes on (step 58). A polishing end point is then detected (step 58) at time point t2 second. An over-polish step (step 60) is then performed after the end point for achieving a substantially global planar surface. Suggestion for the time period of the over-polish step is about 15 to 25 seconds, or 30% of t1. Finally, the hydrophobic layer formed in step 54 is removed by using ozone-containing water (step 64).

Figure 3:
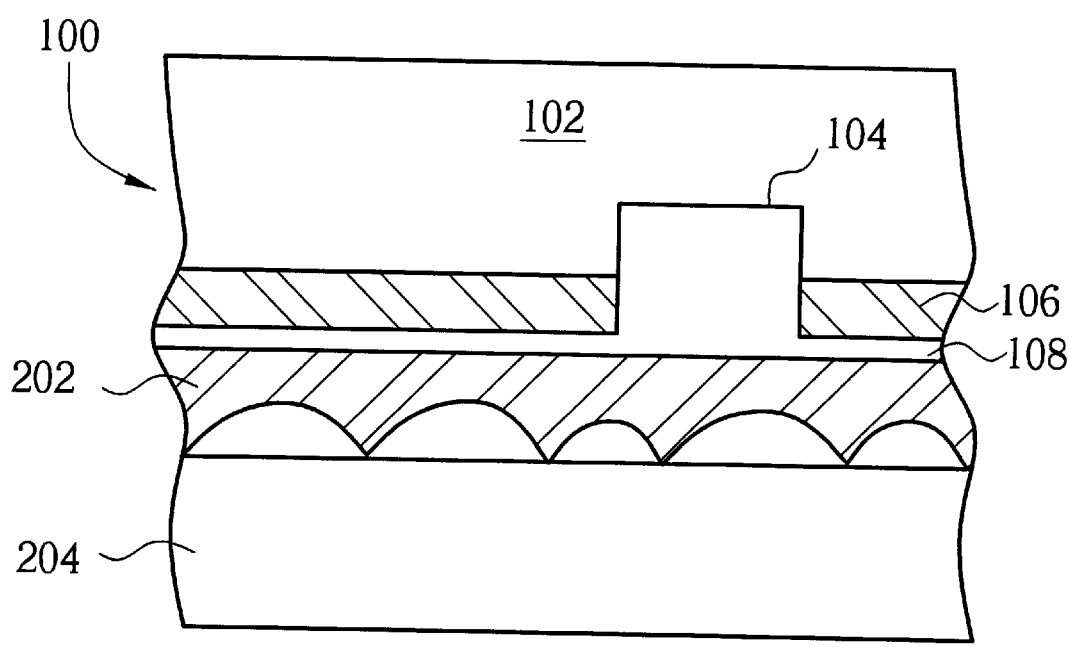
FIG. 3 is a cross-sectional schematic diagram showing a wafer positioned against a polishing pad after polishing for a time period t1.

Please refer to FIG. 3. FIG. 3 is a cross-sectional schematic diagram showing the status of the wafer 100 positioned against a polishing pad 204 after polishing for a time period t1 as set forth in the flow chart (FIG. 2). The polishing pad 204 may be made of various substances, depending on the material being polished. A popular polishing pad medium comprises polyurethane or polyurethane-impregnated polyester felts. An example of a somewhat hard polishing pad is the IC-1000 type pad commercially available from Rodel Products Corporation. A relatively soft pad is the SUBA 500 type pad, also manufactured by Rodel Products Corporation. The slurry sprayed onto the polishing pad 204 creates a slurry layer 202 at the interface between the polishing pad 204 and the wafer 100. Gradually, the trench-fill dielectric 108 is polished to an even surface after t1 seconds. At t1, the polishing stop layer 106 is not yet exposed.

Figure 4:
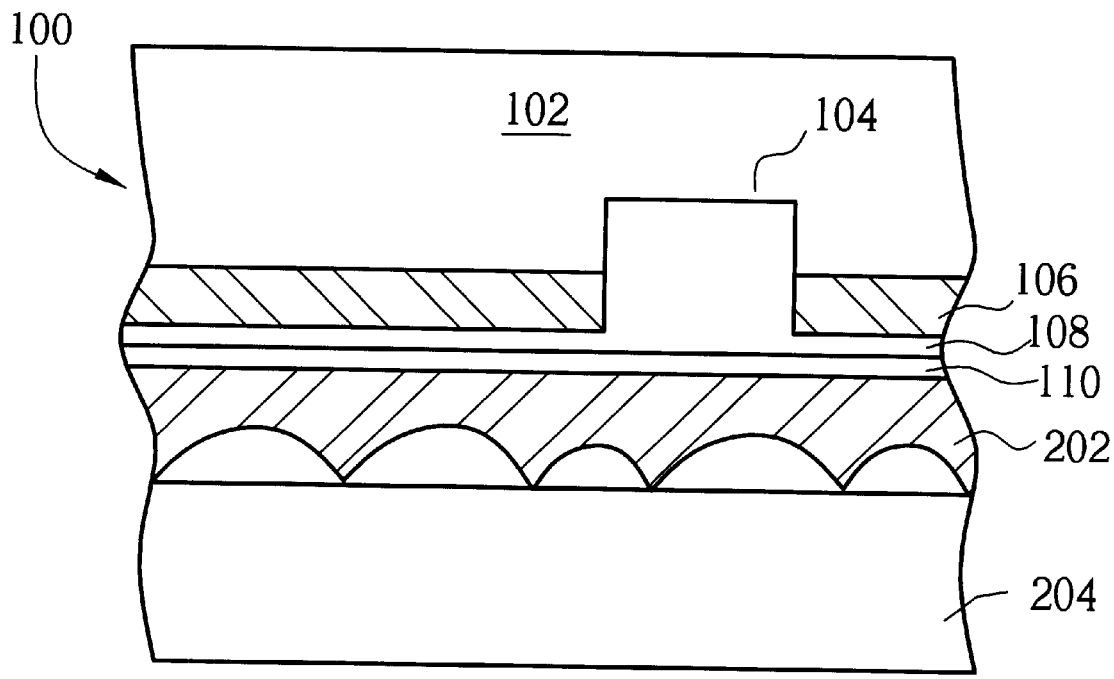
FIG. 4 is a cross-sectional schematic diagram showing a wafer positioned against a polishing pad after the addition of ROH compound into the slurry.

Please refer to FIG. 4. FIG. 4 is a cross-sectional schematic diagram showing the wafer 100 positioned against a polishing pad 204 after the addition of ROH compound into the slurry layer 202 as set forth in the flow chart (FIG. 2). As shown in FIG. 4, when alcohol, such as isopropyl alcohol (IPA), is added into the slurry layer 202, a hydrophobic layer 110 is formed over the trench-fill dielectric 108. The hydrophobic layer 110 blocks the path of H2O and stops further diffusion of H2O into the trench-fill dielectric 108. As a result, the hydration rate or the formation rate of the hydrated silicon is significantly reduced. At this phase, the surface of the trench-fill dielectric 108 is polished via mechanical interaction provided by the polishing pad 204 and the abrasive particles in the slurry layer 202.

Figure 5:
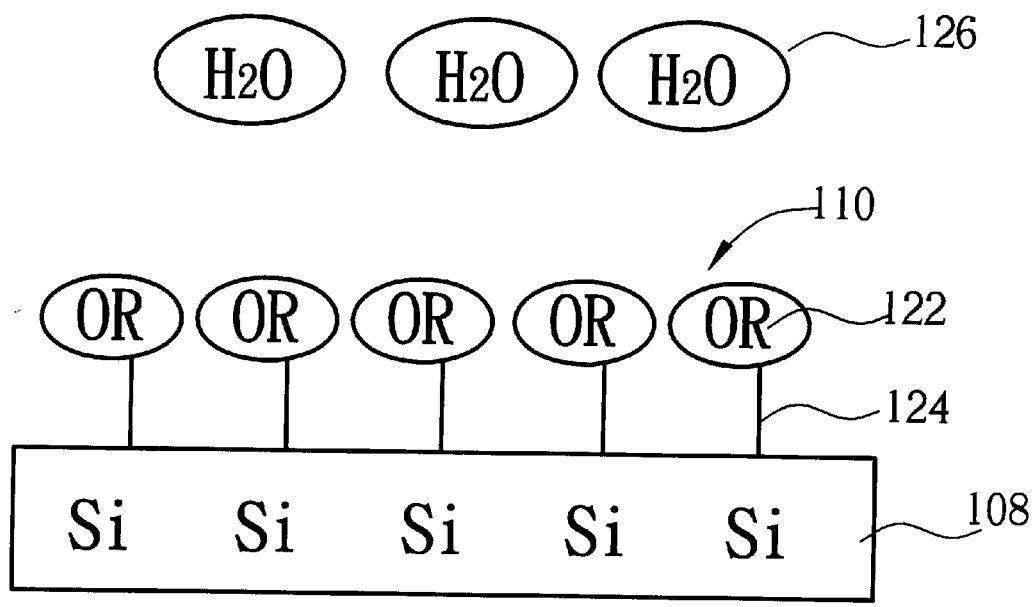
FIG. 5 is a schematic diagram showing the structure of a hydrophobic layer formed over a silicate film.

A structure of a hydrophobic layer formed over a silicate film is shown in FIG. 5. As shown in FIG. 5, the alcohol molecules (R—O—H), having an RO group 122, react with the silicon surface of the trench-fill dielectric silicate film 108 according to the following equation:

Under an alkaline environment, the OR group reacts with silicon dioxide to form Si—OR bondings 124. With the aid of the hydrophobic group, i.e. OR group 122, bonded on the surface of the trench-fill dielectric 108, H$_2$O molecules are blocked in the slurry layer 202 and the hydration of the silicon is theoretically interrupted. After the addition of alcohol at t1 time point, the polishing rate of the trench-fill dielectric 108 reduces.

It should be remembered that the added alcohol will be consumed and additional H2O will be produced. The newly formed H2O will dilute the concentration of the added alcohol after the addition of the alcohol. To solve this problem, after 10 to 15 seconds from the first addition, a second addition of the alcohol is suggested. It is found that two additions of the alcohol result in a better dishing-free wafer than one addition.

Figure 6:
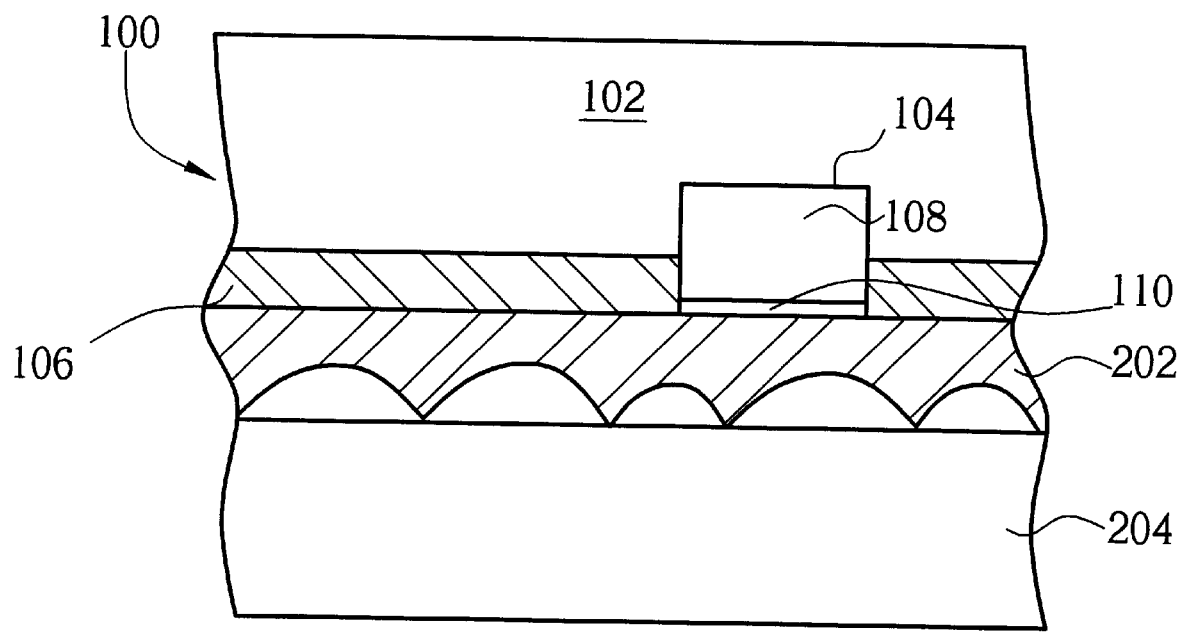
FIG. 6 is a cross-sectional schematic diagram showing a wafer positioned against a polishing pad after performing an over-polish step.

Please refer to FIG. 6. FIG. 6 is a cross-sectional schematic diagram showing the wafer 100 positioned against the polishing pad 204 after performing an over-polish step as set forth in FIG. 2. As shown in FIG. 6, after performing an over-polish step, the polishing stop layer 106 with higher hardness than the trench-fill dielectric 108 is removed in a planar manner to a remaining thickness of about 1000 to 2000 angstroms. By the protection of the hydrophobic layer 110, the trench-fill dielectric 108 is not further over-polished which might cause a dishing profile in the wide trench 104.

Figure 7:
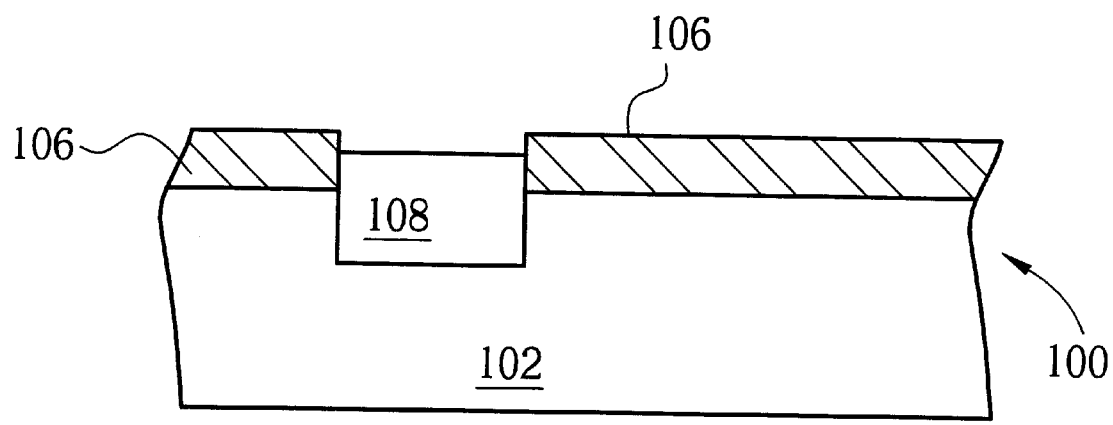
FIG. 7 is a cross-sectional schematic diagram showing a wafer after performing an ozone-containing water cleaning step.

Please refer to FIG. 7. FIG. 7 is a cross-sectional schematic diagram showing the wafer 100 after performing an ozone-containing water cleaning step. As shown in FIG. 7, since the hydrophobic layer 110 contains plenty of organic groups, such as alkyl groups and phenyl groups, they therefore need to be removed so as not to contaminate the device fabrication in the subsequent processes. One proposed method to remove the hydrophobic layer 110 is using ozone-containing water.

In contrast to the prior art method, the present invention uses a simplified process employing alcohol addition to the slurry layer 202 to form a hydrophobic layer 110 which can effectively block H2O molecules from further diffusing into the polished silicate film (i.e. trench-fill dielectric 108). The created organic hydrophobic layer 110 can be completely removed using ozone-containing water. In summary, the proposed method according to the present invention offers a better choice for reducing dishing effects during a CMP process.

Those skilled in the art will readily observe that numerous modifications and alterations of the method may be made while retaining the teachings of the invention. Accordingly, the above disclosure should be construed as limited only by the metes and bounds of the appended claims.

What is claimed is:

1. A method for reducing dishing effects on a top surface of a semiconductor wafer during a chemical mechanical polishing (CMP) process, the top surface of the semiconductor wafer comprising a silicate film, the method comprising:

starting the chemical mechanical polishing process, at a polishing time=0 second, by using an alkaline slurry containing water, abrasives and soluble inorganic salts;

at a polishing time=t1 second, adding a predetermined quantity of one of alcohol or phenol into the alkaline slurry;

at a polishing time−t2 second, detecting an end point of the CMP process, wherein t2>t1; and terminating the CMP process;

wherein the alcohol or phenol added into the slurry create a hydrophobic layer over the silicate film so that the dishing effects of the silicate film during the CMP process are alleviated.

2. The method of claim 1 wherein the silicate film is composed of silicon dioxide, phosphosilicate glass, or borophosphosilicate glass.

3. The method of claim 1 wherein the slurry further comprises a buffer solution and/or surfactants.

4. The method of claim 1 wherein the abrasive is fumed silica.

5. The method of claim 1 wherein the pH of the alkaline slurry is adjusted to within a range of about 7 to 13.

6. The method of claim 5 wherein the pH of the alkaline slurry is adjusted by adding potassium hydroxide (KOH), sodium hydroxide (NaOH), or ammonia into the slurry.

7. The method of claim 1 wherein the alcohol is selected from a group consisting of methyl alcohol, ethyl alcohol, n-propyl alcohol, isopropyl alcohol, butyl alcohol, pentyl alcohol, n-hexanol, cyclohexyl alcohol, heptyl alcohol, and octyl alcohol.

8. The method of claim 1 wherein the phenol is selected from a group consisting of phenol, benzyl alcohol, and diphenylcarbinol.

9. The method of claim 1 further comprising removing the hydrophobic layer using ozone-containing water after the termination of the CMP process.

10. A CMP method for reducing dishing effects, the method comprising:

providing a semiconductor wafer, the top surface of the semiconductor wafer comprising a silicate film;

polishing the semiconductor wafer against a polishing pad, wherein a slurry layer is deposited at the interface between the polishing pad and the silicate film, and the slurry layer comprises water, alkaline solvent, and abrasives;

adding a predetermined quantity of alcohol and/or phenol into the slurry layer;

detecting an end point of the CMP process; and terminating the CMP process;

wherein the alcohol and/or phenol added into the slurry layer create a hydrophobic layer over the silicate film so that the dishing effects of the silicate film during the CMP process are alleviated.

11. The method of claim 10 wherein the silicate film is composed of silicon dioxide, phosphosilicate glass, or borophosphosilicate glass.

12. The method of claim 10 wherein the slurry layer further comprises a buffer solution and/or surfactants.

13. The method of claim 10 wherein the alcohol is selected from a group consisting of methyl alcohol, ethyl alcohol, n-propyl alcohol, isopropyl alcohol, butyl alcohol, pentyl alcohol, n-hexanol, cyclohexyl alcohol, heptyl alcohol, and octyl alcohol.

14. The method of claim 10 wherein the phenol is selected from a group consisting of phenol, benzyl alcohol, and diphenylcarbinol.

15. The method of claim 10 further comprising removing the hydrophobic layer using ozone-containing water after the termination of the CMP process.

* * * * *